United States Patent
Zhang et al.

(10) Patent No.: US 12,439,629 B2
(45) Date of Patent: Oct. 7, 2025

(54) MONOLITHIC CASCODE MULTI-CHANNEL HIGH ELECTRON MOBILITY TRANSISTORS

(71) Applicant: Virginia Tech Intellectual Properties, Inc., Blacksburg, VA (US)

(72) Inventors: Yuhao Zhang, Blacksburg, VA (US); Ming Xiao, Blacksburg, VA (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 478 days.

(21) Appl. No.: 17/939,373

(22) Filed: Sep. 7, 2022

(65) Prior Publication Data
US 2024/0079484 A1  Mar. 7, 2024

(51) Int. Cl.
| | |
|---|---|
| H10D 30/47 | (2025.01) |
| H10D 62/85 | (2025.01) |
| H10D 84/01 | (2025.01) |
| H10D 84/84 | (2025.01) |

(52) U.S. Cl.
CPC ....... H10D 30/475 (2025.01); H10D 62/8503 (2025.01); H10D 84/01 (2025.01); H10D 84/84 (2025.01)

(58) Field of Classification Search
CPC .. H10D 30/475; H10D 62/8503; H10D 84/01; H10D 84/84; H10D 84/406; H10D 84/87; H10D 84/0195; H10D 62/378; H10H 29/8581; H10F 77/953; A01G 13/24
See application file for complete search history.

(56) References Cited

U.S. PATENT DOCUMENTS

| | | |
|---|---|---|
| 7,501,670 B2 | 3/2009 | Murphy |
| 9,035,355 B2 | 5/2015 | Ostermaier et al. |
| 9,337,279 B2 | 5/2016 | Ostermaier et al. |

(Continued)

OTHER PUBLICATIONS

Rongming Chu, Yugang Zhou, Jie Liu, Deliang Wang, K. J. Chen and K. M. Lau, "AlGaN-GaN double-channel HEMTs," in IEEE Transactions on Electron Devices, vol. 52, No. 4, pp. 438-446, Apr. 2005 (Year: 2005).*

(Continued)

*Primary Examiner* — Shih Tsun A Chou
*Assistant Examiner* — Jonathan Keith Little
(74) *Attorney, Agent, or Firm* — Thomas | Horstemeyer, LLP

(57) ABSTRACT

This disclosure provides semiconductor device including a first transistor with a first gate terminal, a first source terminal, and the first drain terminal, the first transistor being a depletion mode transistor and including a plurality of two-dimensional carrier channels of a conductivity type being one of a n-type or a p-type conductivity. The semiconductor device also includes a second transistor with a second gate terminal, a second source terminal, and a second drain terminal, the second transistor being an enhancement mode transistor, a gate-source interconnect forming an electrical connection between the first gate terminal and the second source terminal, and a drain-source interconnect forming an electrical connection between the first source terminal and the second drain terminal. The first transistor and the second transistor are fabricated on the same wafer or substrate.

18 Claims, 9 Drawing Sheets

(56) References Cited

U.S. PATENT DOCUMENTS

| | | |
|---|---|---|
| 9,349,829 B2 | 5/2016 | Ostermaier et al. |
| 9,419,121 B1 | 8/2016 | Teo et al. |
| 9,741,840 B1 | 8/2017 | Moens et al. |
| 9,837,520 B2 | 12/2017 | Ostermaier et al. |
| 9,876,102 B2 | 1/2018 | Teo et al. |
| 10,991,722 B2 | 4/2021 | Lee et al. |
| 2020/0373297 A1* | 11/2020 | Nidhi .................. H01L 27/085 |

OTHER PUBLICATIONS

J.W.Palmour et al., 2014 Int. Symp. Power Semicond. Devices ICs, pp. 79.

J. Liu et al., in 2020 IEEE Int. Electron Devices Meet., pp. 23.2.

M. Yanagihara et al., Phys. Status Solidi A., vol. 206, pp. 1221, 2009.

M. Xiao et al., IEEE Electron Device Lett., vol. 41, No. 8, pp. 1177, 2020.

M. Xiao et al., in 2020 IEEE Int. Electron Devices Meet., pp. 5.4.

M. Xiao et al., IEEE Electron Device Lett., vol. 42, No. 6, pp. 808, 2021.

R. S. Howell et al., in 2014 IEEE Int. Electron Devices Meet., pp. 11.5.

Nela et al., Nat. Electron, vol. 4, pp. 284, 2021.

Hyun-Seop Kim et al., Effects of Recessed-Gate Structure on AlGaN/GaN-on-SiC MIS-HEMTs with Thin AlOxNy MIS Gate, Feb. 15, 2020.

R. Zhang et al., IEEE Trans. Power Electron., vol. 35, pp. 13409, 2020.

Q. Song et al., IEEE Trans. Power Electron., vol. 37, pp. 4148, 2022.

M. Xiao et al., in 2021 IEEE Int. Electron Devices Meet., pp. 5.5.

\* cited by examiner

MONOLITHIC CASCODE MULTI-CHANNEL HIGH ELECTRON MOBILITY TRANSISTORS

TECHNICAL FIELD

This disclosure relates to the semiconductor devices, an in particular to multi-channel transistors.

DESCRIPTION OF THE RELATED TECHNOLOGY

Medium and high voltage devices are commonly used in power electronic circuitry such as, for example, those used in energy processing, electric grids, transportation, etc. One example of a high voltage device incudes bipolar silicon insulated gate bipolar transistor (IGBT) which have operating voltages up to about 6.5 kV. But IGBTs suffer from slow switching speeds. Silicon-carbide (SiC) devices are also popular and can include, for example, SiC metal oxide semiconductor field effect transistors (MOSFETs) that can operate between about 650 and about 10 kV [1]. Gallium-nitride (GaN) based transistors can exhibit physical properties that are superior to those of both the Si based and SiC based transistors. For example, lateral GaN high-electron-mobility transistors (HEMT) operating at about 900 V have been commercialized, and industrial vertical GaN field effect transistors (FETs) are available at 1.2 kV [2]. These devices can have a higher breakdown voltage (BV). Some of these transistors can be depletion-mode (D-mode) HEMTs with specific on-resistance (Rory) that can be higher than that of SiC MOSFETs. As one example, some GaN devices can have a BV of about 10.4 kV with large specific Rory of about 186 mΩ·cm 2 [3].

SUMMARY

In some aspects, the techniques described herein relate to a semiconductor device, including: a first transistor with a first gate terminal, a first source terminal, and a first drain terminal, the first transistor being a depletion mode transistor and including a plurality of two-dimensional carrier channels of a conductivity type being one of a n-type or a p-type conductivity; a second transistor with a second gate terminal, a second source terminal, and a second drain terminal, the second transistor being an enhancement mode transistor; a gate-source interconnect forming an electrical connection between the first gate terminal and the second source terminal; a drain-source interconnect forming an electrical connection between the first source terminal and the second drain terminal; a substrate; and a buffer layer disposed over the substrate, wherein the first transistor and the second transistor are disposed over the buffer layer.

In some aspects, the techniques described herein relate to a semiconductor device, wherein the second gate terminal is positioned over a doped channel.

In some aspects, the techniques described herein relate to a semiconductor device, wherein the second gate terminal is positioned over a subset of the plurality of two-dimensional carrier channels.

In some aspects, the techniques described herein relate to a semiconductor device, wherein the second gate terminal is positioned over a single two-dimensional carrier channel of the plurality of two-dimensional carrier channels.

In some aspects, the techniques described herein relate to a semiconductor device, wherein the drain-source interconnect includes an ohmic contact that makes contact with the plurality of two-dimensional carrier channels.

In some aspects, the techniques described herein relate to a semiconductor device, wherein the drain-source interconnect includes a doped semiconductor sidewall, and wherein the plurality of two-dimensional carrier channels terminate at the doped semiconductor sidewall.

In some aspects, the techniques described herein relate to a semiconductor device, wherein the doped semiconductor sidewall includes n+ or p+ gallium nitride material.

In some aspects, the techniques described herein relate to a semiconductor device, wherein the drain-source interconnect includes a heterostructure, and wherein the plurality of two-dimensional carrier channels terminate at the heterostructure.

In some aspects, the techniques described herein relate to a semiconductor device, wherein the first gate terminal includes a doped semiconductor material disposed between a gate metal and the plurality of two-dimensional carrier channels.

In some aspects, the techniques described herein relate to a semiconductor device, wherein the first gate terminal includes an insulator material disposed between a gate metal and the plurality of two-dimensional carrier channels.

In some aspects, the techniques described herein relate to a semiconductor device, wherein a first drain-to-source length measured between the first drain terminal and the first source terminal along a longitudinal axis of the semiconductor device is greater than a second drain-to-source length measured between the second drain terminal and the second source terminal along the longitudinal axis.

In some aspects, the techniques described herein relate to a semiconductor device, wherein the conductivity type of the plurality of two-dimensional carrier channels is a first conductivity type, the semiconductor device further including: a material of a second conductivity type, the second conductivity type being the other of the n-type and the p-type conductivity, disposed on the plurality of two-dimensional carrier channels, the material of the second conductivity type having a net charge in a depletion region that is substantially equal to the net charge of the plurality of two-dimensional carrier channels when the first transistor is in an off state.

In some aspects, the techniques described herein relate to a semiconductor device, wherein the net charge of the material of the second conductivity type is a function of a thickness of the depletion region of the material of the second conductivity type and an acceptor/donor concentration in the depletion region of the material of the second conductivity type.

In some aspects, the techniques described herein relate to a semiconductor device, wherein the material of the second conductivity type is disposed between a gate metal of the first gate terminal and the plurality of two-dimensional carrier channels.

In some aspects, the techniques described herein relate to a semiconductor device, wherein the net charge of the plurality of two-dimensional carrier channels is equal to a sum of net charges of all two-dimensional channels of the plurality of two-dimensional carrier channels.

In some aspects, the techniques described herein relate to a semiconductor device, wherein the material of the second conductivity type is doped in a graded configuration.

In some aspects, the techniques described herein relate to a semiconductor device, wherein the material of the second conductivity type is doped in a bulk configuration.

In some aspects, the techniques described herein relate to a semiconductor device, wherein the material of the second conductivity type has the net charge in the depletion region that is within 30% of the net charge of the plurality of two-dimensional carrier channels.

In some aspects, the techniques described herein relate to a semiconductor device, wherein each of the plurality of two-dimensional carrier channels is formed at an interface of an aluminum gallium nitride material and a gallium nitride material.

BRIEF DESCRIPTION OF THE DRAWINGS

Like reference numbers and designations in the various drawings indicate like elements.

DETAILED DESCRIPTION

Figure 1:
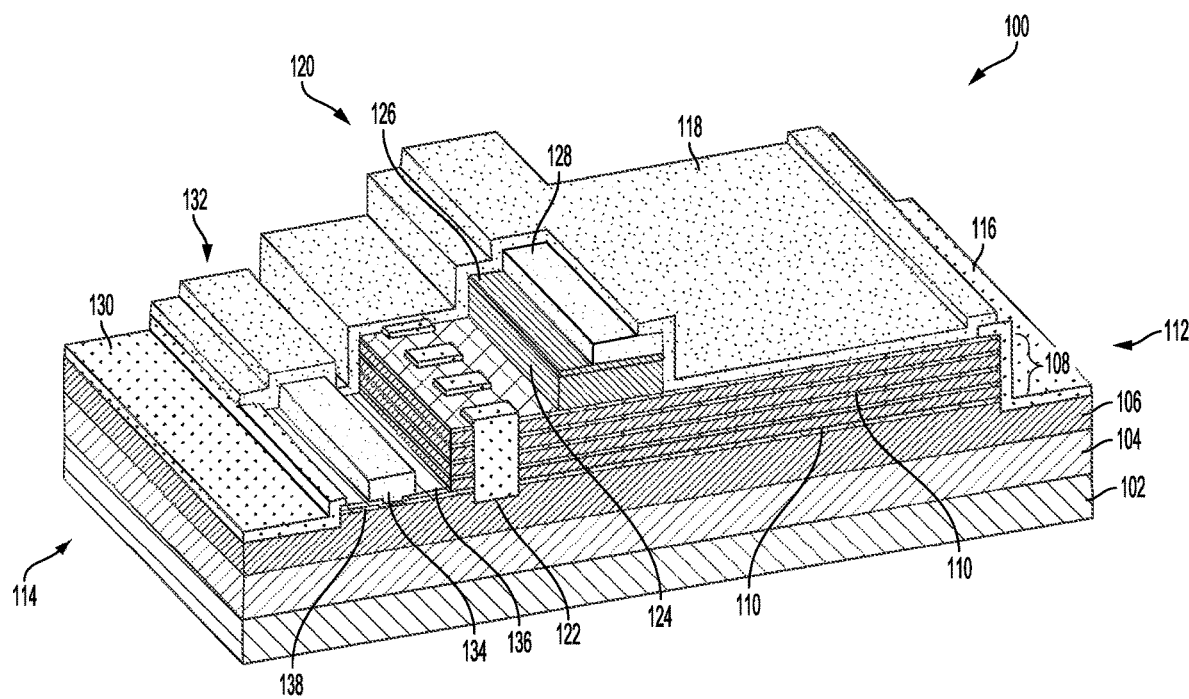
FIG. 1 shows a first example semiconductor device.

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than cx' and less than 'y'. The range can also be expressed as an upper limit, e.g. 'about x, y, z, or less' and should be interpreted to include the specific ranges of 'about x', 'about y', and 'about z' as well as the ranges of less than x', less than y', and less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of".

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

Some medium or high voltage devices can include multi-channel heterostructures and can effectively reduce $R_{ON}$ encountered in Si and SiC based devices. For example, some 3.3~10-kV multi-channel GaN Schottky rectifiers have been demonstrated with specific Rory below the SiC 1-D unipolar limit [4-6]. However, it can be very challenging to design multi-channel HEMTs, as their planar gate operates in deep depletion-mode (D-mode). In some implementations, nanometer-sized fin-shaped gates have been used in multi-channel RF and power HEMTs [7], [8] to shift the threshold voltage ($V_{TH}$) towards zero, e.g., 1300-V E-mode devices enabled by 15-nm gated fins [8]. However, these nanometer sized structures require highly sophisticated lithography processes, which are rarely used in power device manufacturing. Moreover, nanometer-sized gates may make the electric field management within the device and voltage upscaling difficult.

Several example devices are discussed herein that can mitigate the drawbacks of the medium and high voltage devices discussed above. In some examples, the devices can include a monolithic cascode configuration of a low voltage E-mode transistor and a high voltage D-mode transistor. The example devices have low Rory and high Baliga's figure of merit compared to that of Si, SiC and GaN devices. The cascode configuration connects the gate terminal of the high voltage D-mode transistor to the source terminal of the low voltage E-mode transistor, such that the high voltage D-mode transistor can be controlled by the gate of the low voltage transistor. That is, the normally OFF E-mode low voltage transistor can control the normally ON D-mode high voltage transistor.

FIG. 1 shows a first example semiconductor device 100. The first example semiconductor device 100 includes a substrate 102 and a buffer layer 104 disposed over the substrate 102. The first example semiconductor device 100 also includes a gallium nitride layer (i-GaN layer 106) positioned over the buffer layer 104. The substrate 102 can be any suitable material over which the i-GaN layer 106 can be formed. The substrate 102 can include materials such as, for example, silicon, sapphire, GaN, diamond, silicon carbide (SiC), aluminum nitride (AlN), etc. The buffer layer 104 positioned between the substrate 102 and the i-GaN layer 106 can improve the structural stability of the first example semiconductor device 100 by forming a transition layer between the substrate 102 and the i-GaN layer 106. For example, the buffer layer 104 can accommodate for coefficient of thermal expansion mismatch between the substrate 102 and the i-GaN layer 106.

A semiconductor region 108 can be formed over the i-GaN layer 106. The semiconductor region 108 includes alternating layers of aluminum gallium nitride (AlGaN) and GaN, also referred to as AlGaN/GaN heterostructure. The semiconductor region 108 can include any one of the Group III-nitride materials. Spontaneous and strain induced polarization can lead to a high positive polarization in the AlGaN layer, resulting in at least one two-dimensional carrier channel 110. In some instances, the at least one two-dimensional carrier channel 110 can include at least one electron gas (2DEG) channel induced at the AlGaN/GaN interface. The 2DEG channels extend laterally between a first end 112 and a second end 114 of the first example semiconductor device 100. The semiconductor region 108 can include one or more 2DEG channels. As each 2DEG channel is formed at an interface of an AlGaN layer and a GaN layer, multiple 2DEG channels can be formed by including multiple alternating AlGaN and GaN layers. In the example shown in FIG. 1, the semiconductor region 108 includes five 2DEG channels that have a first conductivity type of n-type. In some examples, the semiconductor region 108 can have a second conductivity type of p-type instead. In some such examples, the semiconductor region 108 can include two-dimensional hole gas (2DHG) channels instead of 2DEG channels. The at least one two-dimensional carrier channel 110 can be formed at an interface of materials other than AlGaN and GaN. For example, materials such as AlGaO/GaO or AlN/AlGaN also can be used to form the at least one two-dimensional carrier channel 110. The number of at least one two-dimensional carrier channel 110 is not limited to the five shown in FIG. 1 and can vary between one to tens of two-dimensional carrier channels, for example, about 50 channels. In some examples, the at least one two-dimensional carrier channel 110 need not be formed using heterostructures and can instead also be formed using homogenous materials. For example, the at least one two-dimensional carrier channel 110 can be formed using delta doping in a single semiconductor material such as, for example, silicon, silicon carbide, gallium nitride, gallium oxide, aluminum nitride, and diamond.

A first drain 116 can be formed near the first end 112 of the first example semiconductor device 100. The first drain 116 can be in contact with the semiconductor region 108 an in particular with the at least one two-dimensional carrier channel 110. The first drain 116 can be disposed on a sidewall of the semiconductor region 108 near the first end 112 such that the first drain 116 makes an ohmic contact with the at least one two-dimensional carrier channel 110. In the example shown in FIG. 1, at least a portion of the first drain 116 is disposed on the i-GaN layer 106 and over a portion of the top surface of the semiconductor region 108. The first drain 116 can be formed using metals such as, for example, titanium, aluminum, nickel, gold, and other suitable metals. As discussed further below, the first drain 116 forms a drain terminal of a first transistor.

A passivation material 118 can be deposited over the top surface of the passivation material 118 as well as a portion of the first drain 116 disposed over the top surface of the semiconductor region 108. The passivation material 118 can include one or more of aluminum oxide ($Al_2O_3$), silicon dioxide ($SiO_2$), silicon nitride ($Si_3N_4$), etc. In FIG. 1, a portion of the passivation material 118 is removed to show the underlying structure of the first example semiconductor device 100 more clearly. Generally, the passivation material 118 can cover the entire upper surface of the first example semiconductor device 100. The first example semiconductor device 100 further includes a first gate terminal 120 and a drain-source terminal 122 (also referred to as a "drain-source interconnect"). The first gate terminal 120 can form a gate terminal of the first transistor. The drain-source terminal 122 can form both a first source terminal of the first transistor and a second drain terminal of a second transistor. The first gate terminal 120 can include one or more doped semiconductor layers positioned between the at least one two-dimensional carrier channel 110 and a gate metal layer 128. For example, the first gate terminal 120 can include a p-GaN layer 124 and a p+-GaN layer 126 between the gate metal layer 128 and the at least one two-dimensional carrier channel 110. In some implementations, the p-GaN layer 124 and the p+-GaN layer 126 may be absent. The gate metal layer 128 can include metals such as, for example, titanium, silver, gold, nickel, palladium, aluminum, and combinations thereof. The first gate terminal 120 is disposed over the semiconductor region 108

The drain-source terminal 122, in the example shown in FIG. 1, can be a metal and is positioned such that the drain-source terminal 122 is nearer to the second end 114 of the first example semiconductor device 100 than the first gate terminal 120. In other words, the first gate terminal 120 is positioned between the drain-source terminal 122 and the first drain 116. The drain-source terminal 122, the first gate terminal 120, and the first drain 116 form the first transistor with the drain-source terminal 122 acting as the first source terminal of the first transistor. The drain-source terminal 122 can be formed in a partially discontinuous manner laterally in relation to a longitudinal axis that extends between the first end 112 and the second end 114 or the first drain 116 and a second source terminal 130. The drain-source terminal 122 can be positioned to be in contact with the at least one two-dimensional carrier channel 110 of the semiconductor region 108. In the example shown in FIG. 1, the drain-source terminal 122 is in contact with all the two-dimensional carrier channels. However, in some other examples, the drain-source terminal 122 can be in contact with fewer than all of the two-dimensional carrier channels. The drain-source terminal 122 is positioned slightly offset from the edge of the semiconductor region 108 along the longitudinal axis that extends between the first drain 116 and the second source terminal 130 of the first example semiconductor device 100. However, in some other examples, the drain-source terminal 122 can be positioned at the edge of the semiconductor region 108 along the sidewall of the semiconductor region 108 such that the drain-source terminal 122 makes contact with the at least one two-dimensional carrier channel 110. The drain-source terminal 122 can include discontinuous segments that are electrically connected. These segments can be formed within trenches in the semiconductor region 108. The discontinuous segments provide a larger contact area between the drain-source terminal 122 and the at least one two-dimensional carrier channel 110. In some other examples, the drain-source terminal 122 can instead be continuous.

The second transistor includes a second source terminal 130 and a second gate terminal 132. The second gate terminal 132 is positioned between the second end 114 of the first example semiconductor device 100 and the drain-source terminal 122. In addition, the second gate terminal 132 is positioned between the second source terminal 130 and the drain-source terminal 122. The second gate terminal 132 includes a gate metal 134 disposed over an insulator layer 136, which is in turn disposed over a portion of the semiconductor region 108. In particular, the second gate terminal 132 is disposed over at least one two-dimensional carrier channel of the semiconductor region 108. In the example shown in FIG. 1, the second gate terminal 132 is disposed over a single two-dimensional carrier channel. However, in other examples, the second gate terminal 132 can be disposed over two or more two-dimensional carrier channels. In some examples, the number of two-dimensional carrier channels over which the second gate terminal 132 is disposed can be less than the number of two-dimensional carrier channels in the semiconductor region 108. In the example show in FIG. 1, the bottom-most two-dimensional carrier channel 138 extends towards the second end 114 beyond the drain-source terminal 122 and below the second gate terminal 132. In some other examples, any two-dimensional carrier channel other than the bottom-most two-dimensional carrier channel 138 may extend beyond the drain-source terminal 122 and below the second gate terminal 132.

The second source terminal 130 is positioned nearer to the second end 114 than the second gate terminal 132. In other words, the second gate terminal 132 is positioned between the second source terminal 130 and the drain-source terminal 122. The second source terminal 130 can be disposed over the i-GaN layer 106, with at least a portion of the second source terminal 130 making ohmic contact with the bottom-most two-dimensional carrier channel 138. In instances where more than one two-dimensional carrier channels are extended below the second gate terminal 132, the second source terminal 130 can be in ohmic contact with one or more of such two-dimensional carrier channels. The second source terminal 130 can be formed using metals such as, for example, titanium, aluminum, nickel, gold, and other suitable metals.

Figure 2:
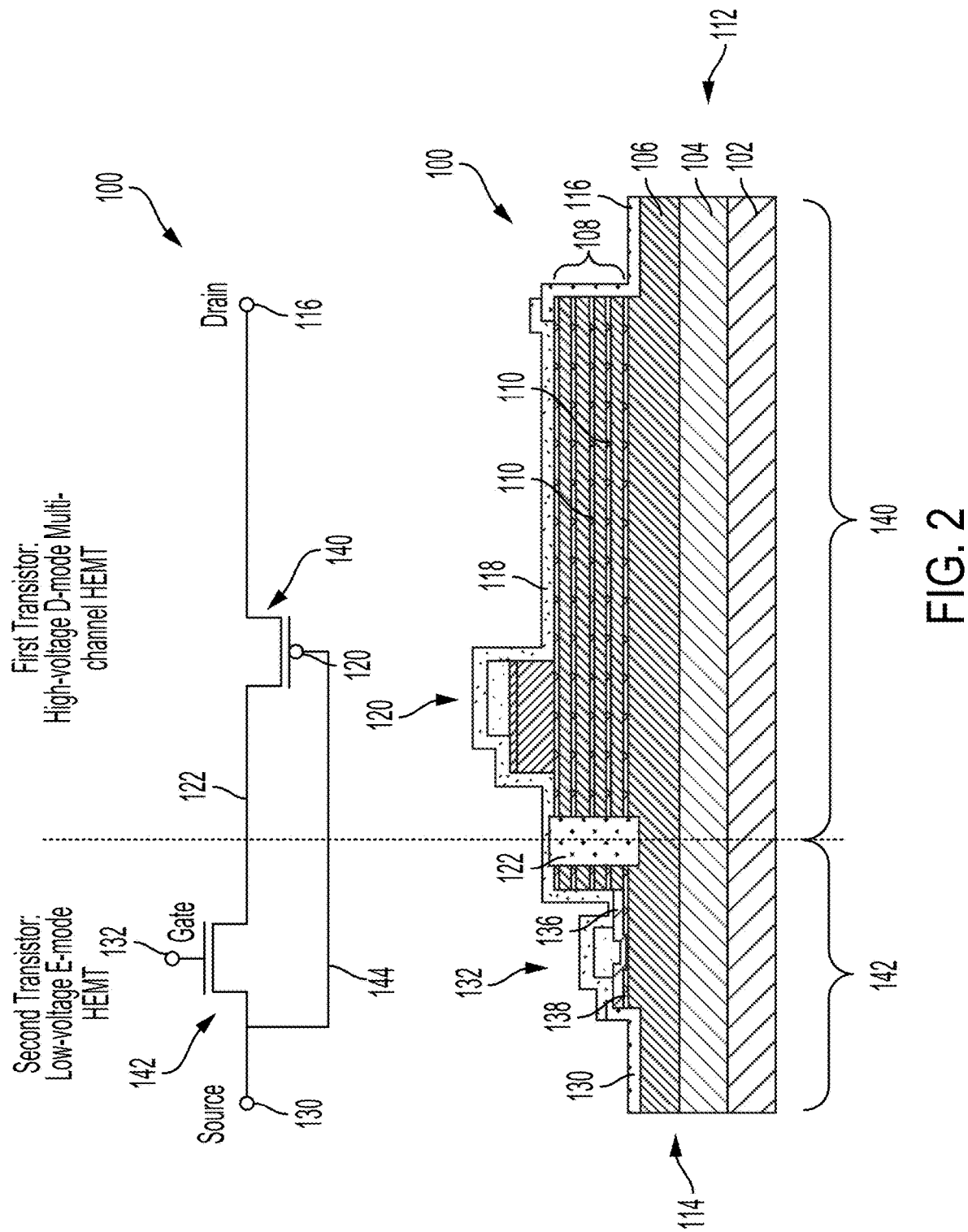
FIG. 2 depicts a cross-sectional view of the first example semiconductor device 100 shown in FIG. 1 in addition to an equivalent circuit schematic.

FIG. 2 depicts a cross-sectional view of the first example semiconductor device 100 shown in FIG. 1 in addition to an equivalent circuit schematic. As mentioned above, the first example semiconductor device 100 is a cascode configuration of a first transistor 140 and a second transistor 142. The first transistor 140 is formed by the first drain 116, the first gate terminal 120 and the drain-source terminal 122 (or the first source terminal), while the second transistor 142 is formed by the second source terminal 130, the second gate terminal 132 and the drain-source terminal 122 (or the second drain terminal). While not shown in FIG. 1 and FIG. 2, the first gate terminal 120 of the first transistor 140 is coupled with the second source terminal 130 of the second transistor 142 by an interconnect 144. The first transistor 140 is a high-electron mobility transistor (HEMT) as the first transistor 140 uses the at least one two-dimensional carrier channel 110 for carrier transport. The second transistor 142 is also a HEMT as the second transistor 142 uses the bottom-most two-dimensional carrier channel 138 for carrier transport.

The cascode configuration of the first example semiconductor device 100 can behave as a three terminal transistor device having a gate terminal (the second gate terminal 132), a source terminal (the second source terminal 130), and a drain terminal (the first drain 116). As discussed below, the low voltage, normally-OFF, enhancement mode (E-mode) second transistor 142 can be used to control the entire high voltage, normally-ON, depletion mode (D-mode) first transistor 140. In this manner, the drawbacks of operating the D-mode high voltage transistor can be mitigated, albeit with the addition of the ON resistance of the E-mode transistor. Nevertheless, the benefits of not having to negatively bias the D-mode transistor for outweigh the relatively small increase in the ON resistance of the first example semiconductor device 100.

The first example semiconductor device 100 can switch ON when the $V_{G2S2}$, i.e., the difference between the voltages at the second gate terminal 132 and the second source terminal 130 is greater than the threshold voltage ($V_{th2}$) of the second transistor 142. The switching ON of the second transistor 142 causes current to flow through the bottom-most two-dimensional carrier channel 138. Because the first transistor 140 is a D-mode transistor, which means it is normally in the ON state, the current flows through the bottom-most two-dimensional carrier channel 138 and through the at least one two-dimensional carrier channel 110 of the semiconductor region 108 facilitated by the drain-source terminal 122. In the ON state, the ON resistance of the first example semiconductor device 100 can have two components. A first component can be the ON resistance of the first transistor 140 and a second component can be the ON resistance of the second transistor 142. But the ON resistance of the second transistor 142 is substantially smaller than that of the first transistor 140. Therefore, the overall ON resistance of the first example semiconductor device 100 is not impacted by the addition of the ON resistance of the second transistor 142.

The first example semiconductor device 100 can be in the OFF state when the voltage across the second gate terminal 132 and the second source terminal 130 is below the threshold voltage of the second transistor 142. While the second transistor 142 is in the OFF state, the state of the first transistor 140 will be determined based on whether the $V_{G1S1}$ of the first transistor 140 is more negative than the threshold voltage $V_{th1}$ of the first transistor 140. The gate terminal of the first transistor 140 is coupled with the source terminal of the second transistor 142, and the source terminal of the first transistor 140 is coupled with the drain terminal of the second transistor 142. Thus, the $V_{G1S1}$ of the first transistor 140 is equal to the $-V_{D2S2}$ of the second transistor 142. In the OFF state, as the voltage between the first drain 116 and the second source terminal 130 increases, the entire blocking voltage appears across the second transistor 142 which is in the OFF state as long as the $V_{D2S2}$ of the second transistor 142 is not higher than the magnitude of the threshold voltage $V_{TH1}$ of the first transistor 140. With progressively increasing the blocking voltage, the $V_{D2S2}$ of the second transistor 142 will become higher than the magnitude of the threshold voltage $V_{TH1}$ of the first transistor 140, at which time the first transistor 140 will switch OFF. With the first transistor 140 switched OFF, the voltage across the second transistor 142 will be limited to the magnitude of the threshold voltage $V_{TH1}$ of the first transistor 140. The remainder of the voltage between the first drain 116 and the second source terminal 130 will appear across the first transistor 140. Thus, even if the voltage across the first example semiconductor device 100 is thousands of volts, the voltage across the second transistor 142 is limited to the magnitude of the threshold voltage of the first transistor 140 and the remainder of the voltage is sustained by the first transistor 140.

Referring again to the second gate terminal 132 of the second transistor 142, in the example shown in FIGS. 1 and 2, a portion of the gate metal 134 and the insulator layer 136 are recessed into the AlGaN layer of the bottom-most two-dimensional carrier channel 138. In some instances, the recession into the AlGaN layer can be a few nanometers. In some instances, the recession can be less than half the thickness of the AlGaN layer. The recessed gate metal 134 and insulator layer 136 can have the benefit of reduced leakage current and positive threshold voltage of the second transistor 142. However, the recession of the gate metal 134 and insulator layer 136 is only an example, and in some other examples, the gate metal 134 and the insulator layer 136 can be disposed over the AlGaN layer of the bottom-most two-dimensional carrier channel 138 without any recession. Such a configuration is generally referred to as metal-insulator-semiconductor (MIS) gate configuration, and can better leakage current and gain characteristics in comparison with gate configurations where the gate metal 134 is in direct contact with the AlGaN layer to form a Schottky contact.

In the example shown in FIGS. 1 and 2, the second transistor 142 can have magnitude of at least one dimension that is smaller than the corresponding dimension of the first transistor 140. For example, a first drain-to-source length measured between the first drain 116 and the drain-source terminal 122 (the first source terminal) along a longitudinal axis of the semiconductor device is greater than a second drain-to-source length measured between the drain-source terminal 122 (the second drain terminal) and the second source terminal 130 along the longitudinal axis of the first example semiconductor device 100.

Figure 3:
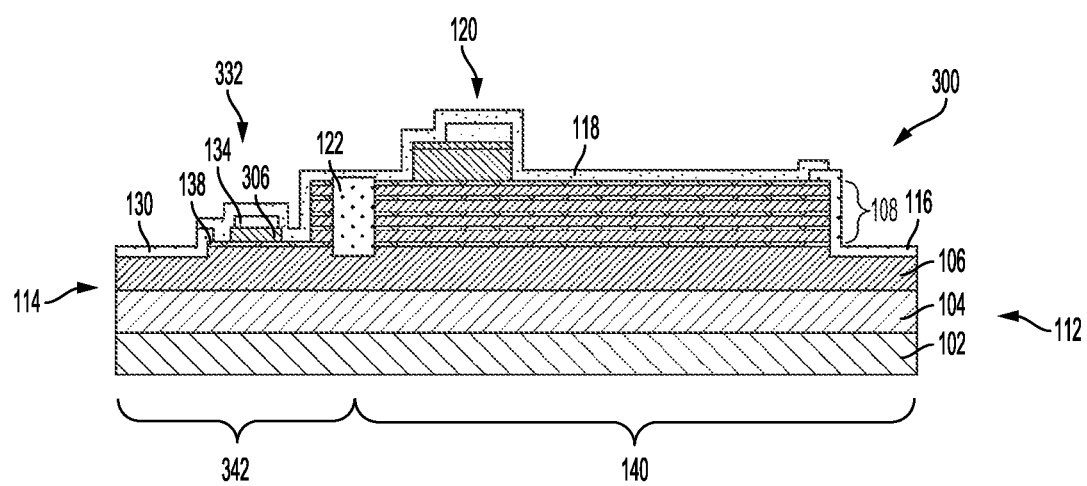
FIG. 3 shows a second example semiconductor device where a second transistor shares a subset of two-dimensional carrier channel with the first transistor.

FIG. 3 shows a second example semiconductor device 300. The second example semiconductor device 300 is similar to the first example semiconductor device 100 discussed above in relation to FIG. 1. However, unlike the first example semiconductor device 100 where the second gate terminal 132 of the second transistor 142 includes an insulator layer 136 positioned between the gate metal 134 and the bottom-most two-dimensional carrier channel 138, a second gate terminal 332 of a second transistor 342 instead includes a p-GaN layer 306 (or generally a doped channel) positioned below the gate metal 134 and above the bottom-most two-dimensional carrier channel 138. While the second example semiconductor device 300 has only a single two-dimensional carrier channel (the bottom-most two-dimensional carrier channel 138) shared between the first transistor 140 and the second transistor 342, in some examples two two-dimensional carrier channels can be shared between the first transistor 140 and the second transistor 342. For example, a two-dimensional carrier channel positioned above the bottom-most two-dimensional carrier channel 138 of the semiconductor region 108 also can extend beyond the drain-source terminal 122 and below the second gate terminal 332. Generally, a subset of the total number of two-dimensional carrier channels can be shared between the first transistor 140 and the second transistor 342. The subset of the total number of two-dimensional carrier channels shared between the first transistor 140 and the second transistor 342 may or may not include the bottom-most two-dimensional carrier channel 138. In some examples, the current matching between the first transistor 140 and the second transistor 342 can improve as a function of the number of two-dimensional carrier channels shared between the two transistors. In other words, the current capacity of the second example semiconductor device 300 in the ON state can increase with an increase in the number of two-dimensional carrier channels shared between the two transistors.

Figure 4:
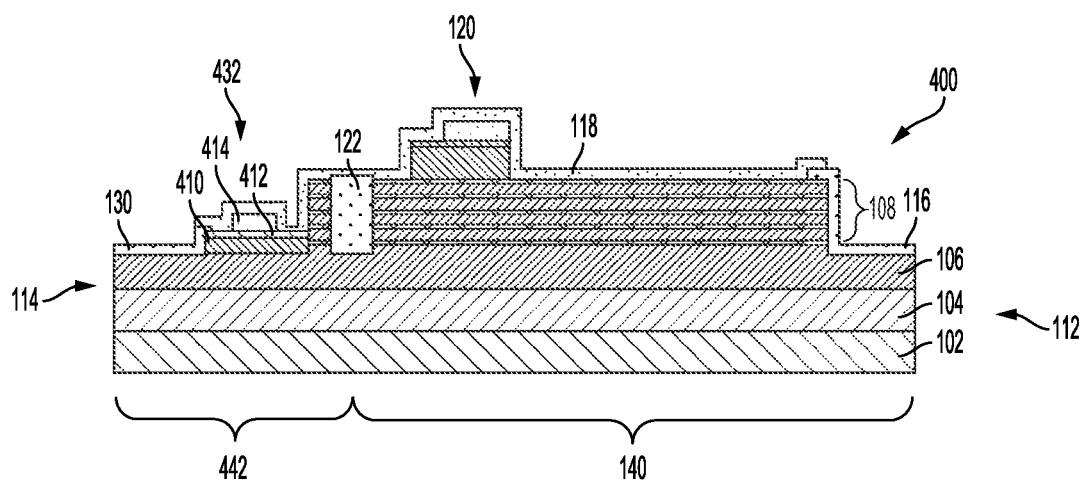
FIG. 4 shows a third example semiconductor device where the gate of the second transistor includes a doped semiconductor material.

FIG. 4 shows a third example semiconductor device 400. The third example semiconductor device 400 is similar to the first example semiconductor device 100 and the second example semiconductor device 300 discussed above, but unlike the first example semiconductor device 100, which included a HEMT second transistor 142, the second transistor 442 in the third example semiconductor device 400 is a doped channel transistor. Specifically, in the third example semiconductor device 400, the second transistor 442 includes a second gate terminal 432, which in turn includes a gate metal 414, an insulation layer 412, and a doped channel layer 410 disposed over the i-GaN layer 106. The second transistor 442 does not share any two-dimensional carrier channels with the first transistor 140. In some instances, the doped channel layer 410 can include an n-GaN material. In some examples, in fabricating the HEMT second transistor 142, it can be challenging to stop etching at the bottom-most two-dimensional carrier channel (or at the desired subset of the two dimensional channels of the semiconductor region 108). As the second transistor 442 does not require any two-dimensional carrier channels for its operation, the fabrication complexity of the third example semiconductor device 400 can be reduced.

Figure 5:
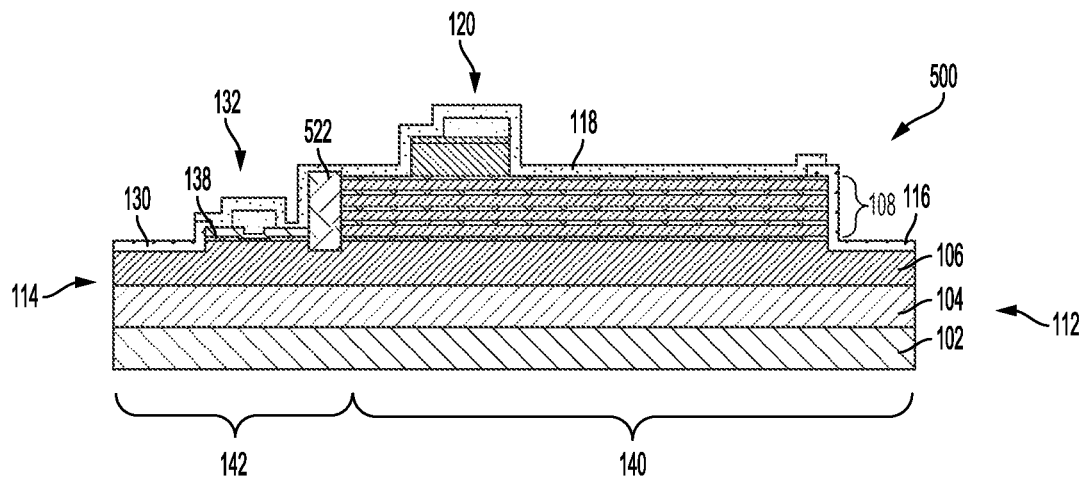
FIG. 5 shows a fourth example semiconductor device where a drain-source terminal includes a doped semiconductor material.

FIG. 5 shows a fourth example semiconductor device 500. The fourth example semiconductor device 500 can be similar to the first example semiconductor device 100 discussed above in relation to FIGS. 1 and 2, however, unlike the drain-source terminal 122 in first example semiconductor device 100, which includes a metal, the fourth example semiconductor device 500 can have a drain-source terminal 522 that includes a doped semiconductor material. The doped semiconductor material can include, for example, an n+ GaN material. In some instances, the doped semiconductor material can include p+ GaN material if the two-dimensional channel is based on 2DHG instead of 2DEG. The drain-source terminal 522 can be positioned in a manner similar to the position of the drain-source terminal 122 in FIG. 1, i.e., in contact with the at least one two-dimensional carrier channel 110 of the semiconductor region 108. The drain-source terminal 522 can be positioned such that the drain-source terminal 522 is situated between the second gate terminal 132 and the semiconductor region 108. In some instances, the drain-source terminal 522 can form a sidewall positioned along the sidewall of the semiconductor region 108 to make contact with one or more of the at least one two-dimensional carrier channel 110. In some instances, the drain-source terminal 522 can be positioned in a manner similar to the drain-source terminal 122 in FIG. 1, where the drain-source terminal 522 is at least partially discontinuous, and extends substantially laterally to a longitudinal axis that extends between the first end 112 and the second end 114 of the fourth example semiconductor device 500. The drain-source terminal 522 also makes electrical contact with the bottom-most two-dimensional carrier channel 138 of the second transistor 142 so that the current carried by the bottom-most two-dimensional carrier channel 138 can flow via the drain-source terminal 522 into the at least one two-dimensional carrier channel 110 of the semiconductor region 108 within the first transistor 140. Using a doped semiconductor material, instead of metal, make the fourth example semiconductor device 500 more compact and can simplify the fabrication process by eliminating the metal deposition step.

While FIG. 5 shows the drain-source terminal 522 in combination with the second gate terminal 132 of the second transistor 142 having a recessed gate metal and insulation layer, the drain-source terminal 522 can also be combined with the gate configurations shown in FIGS. 3 and 4. Specifically, the drain-source terminal 522 can be used in combination with gate terminals of the second transistor 142 having a p-GaN p-GaN based gate 306. Further, the drain-source terminal 522 can be used in combination with the second transistor 142 where the second transistor 142 is a nGaN transistor. In some such instances, the n-GaN layer 410 can be in electrical contact with the drain-source terminal 522 to allow current flowing in the n-GaN layer 410 to flow through the at least one two-dimensional carrier channel 110 via the drain-source terminal 522.

Figure 6:
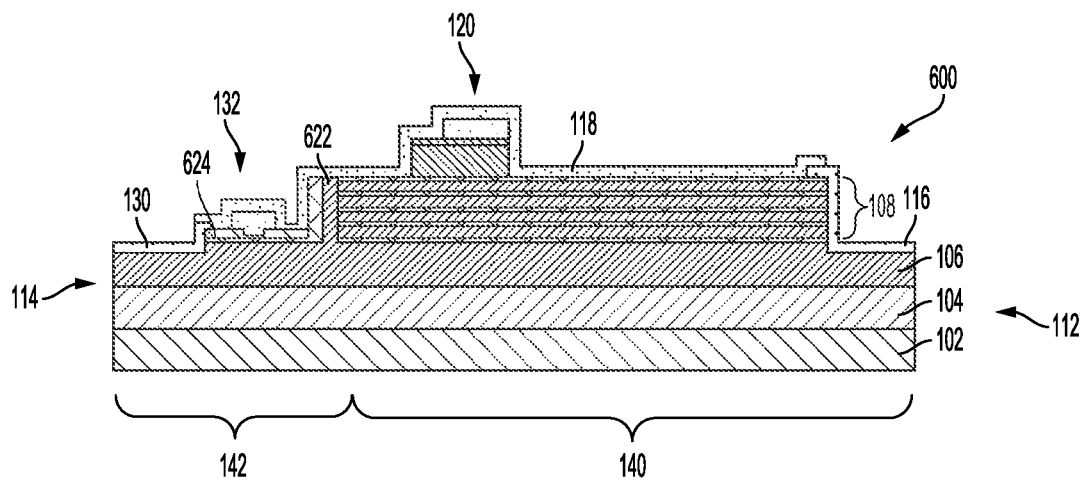
FIG. 6 shows a fifth example semiconductor device where the drain-source terminal includes a heterostructure.

FIG. 6 shows a fifth example semiconductor device 600. The fifth example semiconductor device 600 is similar to the fourth example semiconductor device 500 discussed above in relation to FIG. 5. However, unlike the fourth example semiconductor device 500 where the drain-source terminal includes a doped semiconductor sidewall, the drain-source terminal 622 in the fifth example semiconductor device 600 includes a heterostructure. The heterostructure can include at least one two-dimensional carrier channel such as 2DEG or 2DHG. The heterostructure can be oriented substantially normal to the orientation of the heterostructures formed in the semiconductor region 108. For example, the layers of the heterostructure can deposited on a sidewall of the semiconductor region 108 facing the second gate terminal 132 or the second end 114 of the fourth example semiconductor device 500. At least one of the two-dimensional carrier channels in the semiconductor region 108 can terminate at the heterostructure of the drain-source terminal 622. As a result, carrier flow can occur between the drain-source terminal 622 and the at least one two-dimensional carrier channel 110 in the semiconductor region 108. The heterostructure can extend at least a portion of the sidewall of the semiconductor region 108, which extends laterally with respect to the longitudinal axis of the 600 that extends between the first end 112 and the second end 114. The heterostructure is also positioned to make electrical contact with the carrier channel of the second gate terminal 132 of the second transistor 142. In the example shown in FIG. 6, the carrier channel is another heterostructure 624, which, similar to the heterostructures in the semiconductor region 108, can include 2DEG or 2DHG carrier channel or channels. The heterostructure 624 of the second transistor 142 also can terminate at the heterostructure of the drain-source terminal 622, allowing carrier flow therebetween.

Figure 7:
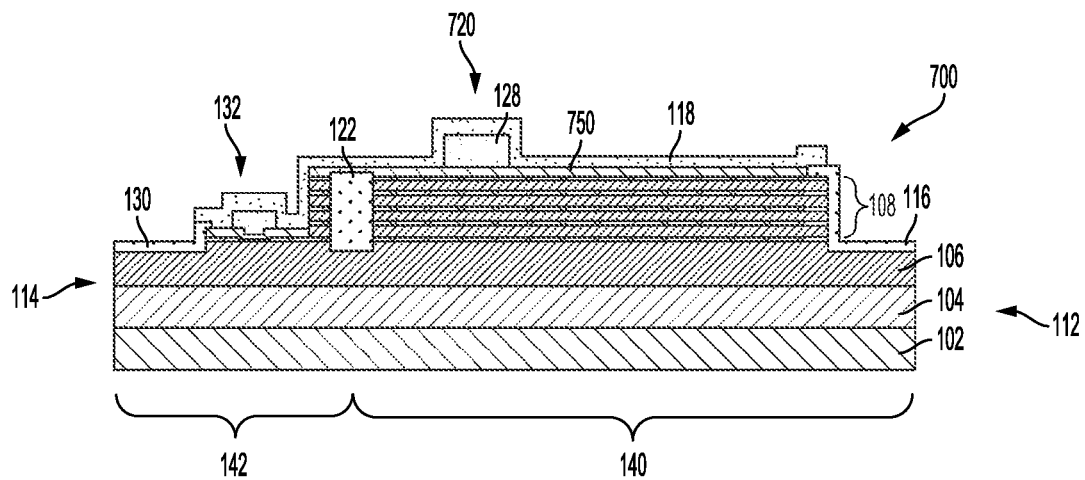
FIG. 7 shows a sixth example semiconductor device where the gate terminal of the first transistor is a metal-insulator-semiconductor gate.

FIG. 7 shows a sixth example semiconductor device 700. The sixth example semiconductor device 700 shown in FIG. 7 is similar to the first example semiconductor device 100 shown in FIG. 1. However, unlike the first example semiconductor device 100, which includes the first gate terminal 120 of the first transistor 140 having the p+-GaN layer 126 and the p-GaN layer 124, the sixth example semiconductor device 700 includes a first transistor 140 having a first gate terminal 720 with an insulator material 750 disposed between the gate metal layer 128 and the semiconductor region 108. In effect, the first gate terminal 720 forms a metal-insulator-semiconductor (MIS) gate. Using an MIS gate can simplify wafer epitaxy and device fabrication by eliminating the need for the fabrication steps involved in etching the p-GaN layer. The first gate terminal 720 shown in FIG. 7 can be readily combined with other example semiconductor devices discussed herein. For example, the first gate terminal 720 including the insulator material can be utilized with the second example semiconductor device 300, the third example semiconductor device 400, the fourth example semiconductor device 500, and the fifth example semiconductor device 600.

Figure 8:
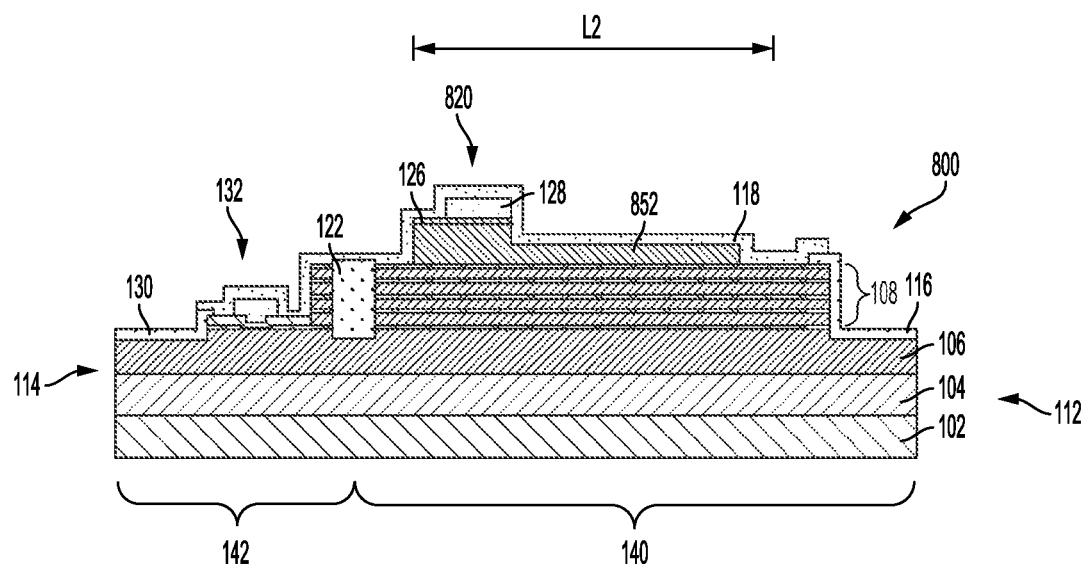
FIG. 8 shows a seventh example semiconductor device where the semiconductor device includes a second conductivity type material disposed over a plurality of two-dimensional carrier channels.

FIG. 8 shows a seventh example semiconductor device 800. At least one material of a second conductivity type that is different from the first conductivity type of the semiconductor region 108 can be disposed over the semiconductor region 108. For example, referring to FIG. 8, a second conductivity type material 852 can be disposed over a top surface of the semiconductor region 108. Where the first conductivity of the semiconductor region 108 is n-type (p-type), the second conductivity type of the second conductivity type material 852 can be p-type (n-type). At least one example of a p-type second conductivity type material 852 can include p-GaN and nickel oxide. At least one example of an n-type second conductivity type material 852 can include n-GaN, n-GaO, and n-AlGaN. The second conductivity type material 852 is disposed between the top surface of the semiconductor region 108 and one or more layers of the gate terminal 820. For example, the one or more materials of the gate terminal 820 can include a p+GaN material 126 disposed over the second conductivity type material 852 and the gate metal layer 128 disposed over the p+GaN material 126. The second conductivity type material 852 can extend at one end (nearer to the second end 114) between the drain-source terminal 122 and the gate metal layer 128. The second conductivity type material 852 also can extend at the other end (nearer to the first end 112) between the gate metal layer 128 and the first drain 116. At this end, the second conductivity type material 852 does not make electrical contact with the first drain 116.

Figure 9:
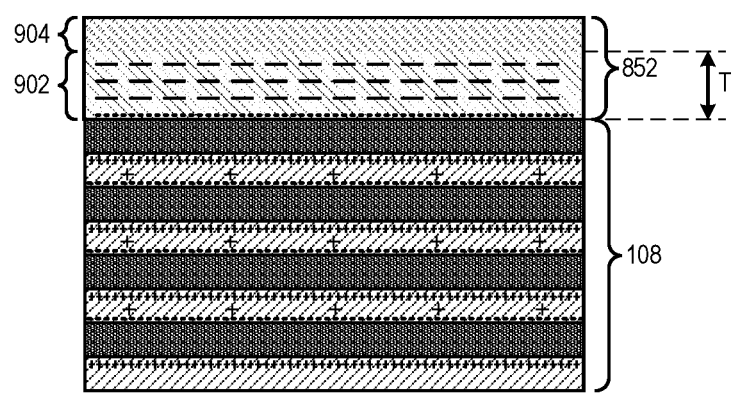
FIG. 9 shows a cross-sectional view of the depletion charge distributions in a portion of the seventh example semiconductor device shown in FIG. 8.

FIG. 9 shows a cross-sectional view of the depletion charge distributions in a portion of the seventh example semiconductor device 800 shown in FIG. 8. In particular, FIG. 9 shows the semiconductor region 108 and the second conductivity type material 852 under OFF-state blocking bias conditions, i.e., when the seventh example semiconductor device 800 is in the OFF state. The at least one two-dimensional carrier channel 110 can have a net charge. In instances of where the at least one two-dimensional carrier channel 110 includes 2DEG channels, the net charge can be a positive, while in instances where the at least one two-dimensional carrier channel 110 includes 2DHG channels, the net charge can be negative. In particular, net donors provide electrons in the 2DEG channels, which electrons are depleted under OFF-state blocking bias leaving behind positive net charges. Similarly, net acceptors provide the holes in the 2DHG channels, which holes are depleted in OFF-state blocking bias leaving behind negative net charges. The net charge of the semiconductor region 108 can be a sum of the net charges of each of the at least one two-dimensional carrier channel 110. For example, where the semiconductor region 108 include four 2DEG channels, the net charge of the semiconductor region 108 can be equal to the sum of the net charge of each of the four 2DEG channels.

The net charge of the second conductivity type material 852 can be equal to the acceptor concentration in the depletion region of the second conductivity type material 852 times the area of the second conductivity type material 852 times the thickness T of the depletion region in the second conductivity type material 852. The area of the second conductivity type material 852 can be the produce of a width and the length of the second conductivity type material 852 over the semiconductor region 108 in a plane that is normal to the plane in which the thickness T is measured. For example, referring to FIG. 8, the area of the 852 can be measured as a product of the length L2 times a width that is in a dimension normal to the page. The second conductivity type material 852 in the seventh example semiconductor device 800 shown in FIG. 8 is a p-type material. In such examples, the second conductivity type material 852 is doped with acceptor material such as, for example, magnesium, zinc, cadmium, etc. In instances, where the second conductivity type material 852 is a n-type material, the second conductivity type material 852 can be doped with donor materials such as, for example, substitutional silicon, substitutional germanium, substitutional oxygen, etc. In such examples, the net charge of the second conductivity type material 852 would be determined based on the donor concentration instead of the acceptor concentration mentioned above in relation to the p-type second conductivity type material 852.

In the OFF state, the net charge at the depletion region 902 of the second conductivity type material 852 is substantially equal to the net charge at the semiconductor region 108. In particular, referring again to FIG. 9, the second conductivity type material 852 includes a depletion region 902 and a non-depletion region 904 under OFF-state blocking bias conditions. The depletion region 902 includes negative acceptor ions. Similarly, positive donor ions are left behind in the semiconductor region 108. The depletion region 902 can extend along the length L2 shown in FIG. 8. The negative acceptor ions in the depletion region 902 are substantially equal to the positive donor ions in the semiconductor region 108. As referred to herein, substantially equal means that the net charges are within ±30% of each other. For example, the net charge of the semiconductor region 108 can be considered substantially equal to the net charge of the second conductivity type material 852 if the value of the net charge of the semiconductor region 108 is within a range of 0.7 times to 1.3 times the net charge of the second conductivity type material 852 within the depletion region 902. Similarly, the net charge of the second conductivity type material 852 within the depletion region 902 can be considered substantially equal to the net charge of the semiconductor region 108 if the value of the net charge of the second conductivity type material 852 within the depletion region 902 is within a range of 0.7 times to 1.3 times the value of the net charge of the semiconductor region 108. In some examples, the substantially equal means that the net charges are within ±20% of each other. In some examples, substantially equal means that the net charges are within ±10% of each other. In some examples, substantially equal means that the net charges are within ±5% of each other. As an example, the OFF-state blocking bias voltage when the seventh example semiconductor device 800 is in the OFF state can be tens to thousands of volts. As an example, the OFF-state blocking bias voltage can be at most 10 kV. In some examples, the OFF-state blocking bias voltage can be at most 100 kV. In some other examples, the OFF-state blocking bias voltage can be 1000 kV.

It should be noted that the thickness T of the depletion region 902 can vary based on the magnitude of the OFF-state blocking bias voltage. That is, the thickness T of the depletion region 902 increases with an increase in the OFF-state blocking bias voltage. In some instances, where the OFF-state blocking bias voltage is high enough that the depletion region 902 extends the entire thickness of the second conductivity type material 852, the thickness T can be the thickness of the second conductivity type material 128.

In some examples, the second conductivity type material 852 can be uniformly doped. That is, the dopant concentration is uniform across the thickness T of the second conductivity type material 852. However, in some instances, the doping concentration may be non-uniform. For example, in some instances, the second conductivity type material 852 can be doped in a graded configuration. In a graded configuration, the doping concentration can increase or decrease incrementally as a function of the distance from the top or the bottom of the second conductivity type material 852. In some examples, the rate of increase in the doping concentration can be linear. In some other examples, the rate of increase in the doping concentration can be non-linear such as, for example, an exponential function or a square function of the distance, or some other non-linear function. In some examples, the second conductivity type material 852 can be doped in a bulk configuration, which includes doping in a three-dimensional configuration and is in contrast with delta doping, which results in a narrow doping profile.

It should be noted that features of any one of the example semiconductor devices discussed herein can be combined with features of one or more other example semiconductor devices. For example, referring to second example semiconductor device 300 discussed above in relation to FIG. 3, the second gate terminal 332 including the p-GaN layer 306 can be combined with the features of the fourth example semiconductor device 500 including the drain-source terminal 522. Similarly, the second gate terminal 332 of the second example semiconductor device 300 can be combined with the features of the fifth example semiconductor device 600 discussed above in relation to FIG. 6 including the drain-source terminal 622. In some examples, the features of the second example semiconductor device 300 can be combined with the features of the sixth example semiconductor device 700 including the first gate terminal 720 having the gate metal layer 128 and the insulator material 750. Similarly, the features of the second example semiconductor device 300 can be combined with the features of the seventh example semiconductor device 800 including the first transistor 140 having the second conductivity type material 852.

Features of the third example semiconductor device 400 including the second gate terminal 432 of the second transistor 442 discussed above in relation to FIG. 4 can be combined with features of one or more other example semiconductor devices discussed herein. For example, the second gate terminal 432 including the insulation layer 412 positioned between the gate metal 414 and the doped channel layer 410 can be combined with the drain-source terminal 522 of the fourth example semiconductor device 500 discussed above in relation to FIG. 5. Similarly, the second gate terminal 432 can be combined with the drain-source terminal 622 of the fifth example semiconductor device 600 discussed above in relation to FIG. 6. The second gate terminal 432 also can be combined with the first gate terminal 720 including the insulator material 750 positioned between the gate metal layer 128 and the insulator material 750 of the sixth example semiconductor device 700 discussed above in relation to FIG. 7. The second gate terminal 432 can also be combined with the gate terminal 820 including the gate metal layer 128, the p+GaN material 126 and the second conductivity type material 852 of the seventh example semiconductor device 800 as discussed herein in relation to FIG. 8.

Features of the fourth example semiconductor device 500 can be combined with features of one or more example semiconductor devices discussed herein. For example, the drain-source terminal 522 of the fourth example semiconductor device 500 can be combined with first gate terminal 720 including the gate metal layer 128 and the insulator material 750 of the sixth example semiconductor device 700 discussed above in relation to FIG. 7. Further, the drain-source terminal 522 of the fourth example semiconductor device 500 can be combined with the gate terminal 820 including the gate metal layer 128 positioned between the gate metal layer 128 and the second conductivity type material 852 of the seventh example semiconductor device 800 discussed above in relation to FIG. 8.

Features of the fifth example semiconductor device 600 can be combined with features of one or more example semiconductor devices discussed herein. For example, the drain-source terminal 622 of the fifth example semiconductor device 600 discussed above in relation to FIG. 6 can be combined with the first gate terminal 720 including the insulator material 750 positioned between the gate metal layer 128 and the insulator material 750 of the sixth example semiconductor device 700 discussed above in relation to FIG. 7. The drain-source terminal 622 of the fifth example semiconductor device 600 can also be combined with the gate terminal 820 including the gate metal layer 128, the p+GaN material 126 and the second conductivity type material 852 of the seventh example semiconductor device 800 as discussed herein in relation to FIG. 8.

In some examples, an example semiconductor device can combine features of two or more example semiconductor devices discussed herein. For example, a semiconductor device can combine any one of the various types of the second transistor (e.g., the second transistor 142 with the second gate terminal 132 discussed in relation to FIG. 1, the second transistor 342 with the second gate terminal 332 discussed in relation to FIG. 3, and the second transistor 442 with the second gate terminal 432 discussed above in relation to FIG. 4) with any one of the various types of drain-source terminal (e.g., the drain-source terminal 122 discussed in relation to FIG. 1, the drain-source terminal 522 discussed in relation to FIG. 5, and the drain-source terminal 622 discussed in relation to FIG. 6) with any one of the various types of first transistor (e.g., the second transistor 142 with first gate terminal 120 discussed in relation to FIG. 1 and the first transistor 140 with net charge balance discussed in relation to FIGS. 8 and 9) discussed in relation to the various examples herein.

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] J. W. Palmour et al., 2014 Int. Symp. Power Semicond. Devices ICs, pp. 79.
[2] J. Liu et al., in 2020 IEEE Int. Electron Devices Meet., pp. 23.2.
[3] M. Yanagihara et al., Phys. Status Solidi A., vol. 206, pp. 1221, 2009.
[4] M. Xiao et al., IEEE Electron Device Lett., vol. 41, no. 8, pp. 1177, 2020.
[5] M. Xiao et al., in 2020 IEEE Int. Electron Devices Meet., pp. 5.4.
[6] M. Xiao et al., IEEE Electron Device Lett., vol. 42, no. 6, pp. 808, 2021.
[7] R. S. Howell et al., in 2014 IEEE Int. Electron Devices Meet., pp. 11.5.
[8] L. Nela et al., Nat. Electron, vol. 4, pp. 284, 2021.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A semiconductor device, comprising:
a first transistor with a first gate terminal, a first source terminal, and a first drain terminal, the first transistor being a depletion mode transistor and including a plurality of two-dimensional carrier channels of a conductivity type being one of a n-type or a p-type conductivity;
a second transistor with a second gate terminal, a second source terminal, and a second drain terminal, the second transistor being an enhancement mode transistor, wherein the second gate terminal is positioned over a single two-dimensional carrier channel of the plurality of two-dimensional carrier channels;
a gate-source interconnect forming an electrical connection between the first gate terminal and the second source terminal;
a drain-source interconnect forming an electrical connection between the first source terminal and the second drain terminal;
a substrate; and
a buffer layer disposed over the substrate, wherein the first transistor and the second transistor are disposed over the buffer layer.

2. A semiconductor device, comprising:
a first transistor with a first gate terminal, a first source terminal, and a first drain terminal, the first transistor being a depletion mode transistor and including a plurality of two-dimensional carrier channels of a conductivity type being one of a n-type or a p-type conductivity;
a second transistor with a second gate terminal, a second source terminal, and a second drain terminal, the second transistor being an enhancement mode transistor;
a gate-source interconnect forming an electrical connection between the first gate terminal and the second source terminal;
a substrate; and
a buffer layer disposed over the substrate, wherein the first transistor and the second transistor are disposed over the buffer layer; and
a drain-source interconnect forming an electrical connection between the first source terminal and the second drain terminal, wherein:
the drain-source interconnect includes an ohmic contact that makes contact with the plurality of two-dimensional carrier channels; or
the drain-source interconnect includes a doped semiconductor sidewall, and wherein the plurality of two-dimensional carrier channels terminate at the doped semiconductor sidewall; or
the drain-source interconnect includes a heterostructure, and wherein the plurality of two-dimensional carrier channels terminate at the heterostructure.

3. The semiconductor device of claim 2, wherein the second gate terminal is positioned over a doped channel.

4. The semiconductor device of claim 2, wherein the second gate terminal is positioned over a subset of the plurality of two-dimensional carrier channels.

5. The semiconductor device of claim 2, wherein the doped semiconductor sidewall includes n+ or p+ gallium nitride material.

6. The semiconductor device of claim 2, wherein each of the plurality of two-dimensional carrier channels is formed at an interface of an aluminum gallium nitride material and a gallium nitride material.

7. A semiconductor device, comprising:
a first transistor with a first gate terminal, a first source terminal, and a first drain terminal, the first transistor being a depletion mode transistor and including a plurality of two-dimensional carrier channels of a conductivity type being one of a n-type or a p-type conductivity, wherein the first gate terminal includes a doped semiconductor material or an insulator material disposed between a gate metal and the plurality of two-dimensional carrier channels;
a second transistor with a second gate terminal, a second source terminal, and a second drain terminal, the second transistor being an enhancement mode transistor;

a gate-source interconnect forming an electrical connection between the first gate terminal and the second source terminal;
a drain-source interconnect forming an electrical connection between the first source terminal and the second drain terminal;
a substrate; and
a buffer layer disposed over the substrate, wherein the first transistor and the second transistor are disposed over the buffer layer.

8. The semiconductor device of claim 7, wherein the second gate terminal is positioned over a doped channel.

9. The semiconductor device of claim 7, wherein the second gate terminal is positioned over a subset of the plurality of two-dimensional carrier channels.

10. The semiconductor device of claim 7, wherein each of the plurality of two-dimensional carrier channels is formed at an interface of an aluminum gallium nitride material and a gallium nitride material.

11. A semiconductor device, comprising:
a first transistor with a first gate terminal, a first source terminal, and a first drain terminal, the first transistor being a depletion mode transistor and including a plurality of two-dimensional carrier channels of a conductivity type being one of a n-type or a p-type conductivity;
a second transistor with a second gate terminal, a second source terminal, and a second drain terminal, the second transistor being an enhancement mode transistor;
a gate-source interconnect forming an electrical connection between the first gate terminal and the second source terminal;
a drain-source interconnect forming an electrical connection between the first source terminal and the second drain terminal, wherein a first drain-to-source length measured between the first drain terminal and the first source terminal along a longitudinal axis of the semiconductor device is greater than a second drain-to-source length measured between the second drain terminal and the second source terminal along the longitudinal axis;
a substrate; and
a buffer layer disposed over the substrate, wherein the first transistor and the second transistor are disposed over the buffer layer.

12. A semiconductor device, comprising:
a first transistor with a first gate terminal, a first source terminal, and a first drain terminal, the first transistor being a depletion mode transistor and including a plurality of two-dimensional carrier channels of a conductivity type being one of a n-type or a p-type conductivity, wherein the conductivity type of the plurality of two-dimensional carrier channels is a first conductivity type, the semiconductor device further comprising:
a material of a second conductivity type, the second conductivity type being the other of the n-type and the p-type conductivity, disposed on the plurality of two-dimensional carrier channels, the material of the second conductivity type having a net charge in a depletion region that is substantially equal to a net charge of the plurality of two-dimensional carrier channels when the first transistor is in an off state;
a second transistor with a second gate terminal, a second source terminal, and a second drain terminal, the second transistor being an enhancement mode transistor;
a gate-source interconnect forming an electrical connection between the first gate terminal and the second source terminal;
a drain-source interconnect forming an electrical connection between the first source terminal and the second drain terminal;
a substrate; and
a buffer layer disposed over the substrate, wherein the first transistor and the second transistor are disposed over the buffer layer.

13. The semiconductor device of claim 12, wherein the net charge of the material of the second conductivity type is a function of a thickness of the depletion region of the material of the second conductivity type and an acceptor/donor concentration in the depletion region of the material of the second conductivity type.

14. The semiconductor device of claim 12, wherein the material of the second conductivity type is disposed between a gate metal of the first gate terminal and the plurality of two-dimensional carrier channels.

15. The semiconductor device of claim 12, wherein the net charge of the plurality of two-dimensional carrier channels is equal to a sum of net charges of all two-dimensional channels of the plurality of two-dimensional carrier channels.

16. The semiconductor device of claim 12, wherein the material of the second conductivity type is doped in a graded configuration.

17. The semiconductor device of claim 12, wherein the material of the second conductivity type is doped in a bulk configuration.

18. The semiconductor device of claim 12, wherein the material of the second conductivity type has the net charge in the depletion region that is within 30% of the net charge of the plurality of two-dimensional carrier channels.

* * * * *